United States Patent [19]

Sato et al.

[11] Patent Number: 5,864,567
[45] Date of Patent: Jan. 26, 1999

[54] DATA MEMORY APPARATUS

[75] Inventors: Masafumi Sato, Kadoma; Shozo Fujii, Hirakata, both of Japan

[73] Assignee: Matsushita Electric Industrial Co., Ltd., Osaka, Japan

[21] Appl. No.: 623,167

[22] Filed: Mar. 28, 1996

[30] Foreign Application Priority Data

Mar. 30, 1995 [JP] Japan .................................... 7-073390

[51] Int. Cl.⁶ .................................................. H03M 13/00
[52] U.S. Cl. ........................................ 371/37.4; 371/40.11
[58] Field of Search ............................ 371/37.01, 37.2, 371/37.4, 37.7, 37.8, 40.11, 40.12, 51.1, 50.1, 49.1, 47.1, 48

[56] References Cited

U.S. PATENT DOCUMENTS

| | | | |
|---|---|---|---|
| 4,958,350 | 9/1990 | Worley, III et al. | 371/37.4 |
| 5,060,221 | 10/1991 | Sako et al. | 371/37.4 |
| 5,392,299 | 2/1995 | Rhines et al. | 371/37.5 |
| 5,546,409 | 8/1996 | Karasawa | 371/37.4 |

FOREIGN PATENT DOCUMENTS 62-293291  12/1987  Japan .

*Primary Examiner*—Paul P. Gordon
*Assistant Examiner*—Thomas E. Brown
*Attorney, Agent, or Firm*—Spencer & Frank

[57] ABSTRACT

There is provided a data memory apparatus which can efficiently use a general-purpose DRAM as a memory used during the digital data error correcting and modifying processing. The apparatus is comprised of a DRAM, a DRAM access unit and an error correcting circuit. Input digital data is first subjected to the error correcting processing by means of the error correcting circuit, assigned with a result of the error correcting processing and transferred to the DRAM access unit. The DRAM access unit accesses the DRAM in a page mode to store the data in the DRAM.

12 Claims, 10 Drawing Sheets

STRUCTURE OF IMAGE DATA OF ONE TRACK

RAS : ROW ADDRESS STROBE SIGNAL
CAS : COLUMN ADDRESS STROBE SIGNAL
ADRS : ADDRESS BUS
WE : WRITE ENABLE SIGNAL
OE : OUTPUT ENABLE SIGNAL
DQ : DATA BUS
RowAdr : ROW ADDRESS
ColAdr : COLUMN ADDRESS

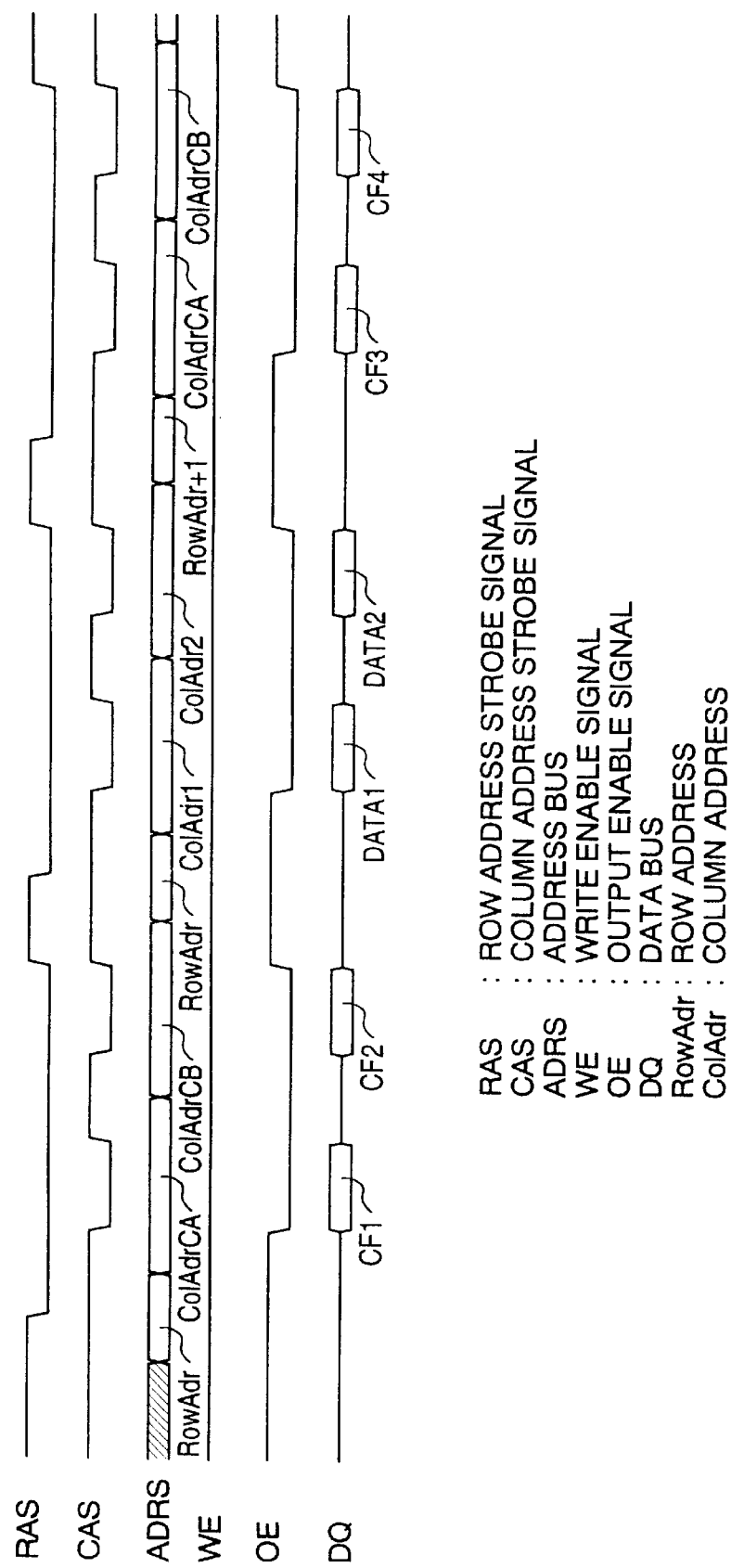

DATA MEMORY APPARATUS

BACKGROUND OF THE INVENTION

1. Field of the Invention

The present invention relates to a data memory apparatus for storing data.

2. Description of the Related Art

In recent years, the development of digital apparatuses such as digital videotape recorders ("VTR's") using the digital video ("DV") format, has been promoted, and a data memory apparatus has been used which stores digital data when the error correcting and modifying processing is effected in the course of the digital data processing.

The memory considered for use in the data memory apparatus is a static random-access memory ("SRAM") or dynamic random-access memory ("DRAM"). In the SRAM, the application of one address is sufficient to access one data, and so the access speed is high. Accordingly, in an application to the digital VTR, which requires error correcting and modifying processing having large capacity and high speed, the SRAM is generally used as the memory. On the other hand, the DRAM has a smaller packaging area and is of lower cost than the SRAM, and the possibility of using the DRAM as the memory has been a long felt need.

However, the DRAM has a two-dimensional matrix address space to enable one data to be accessed only when a row address is accessed and thereafter a column address is accessed. Hence when the DRAM is used in the conventional way, the number of access operations leads to a delay in access, raising a problem in that the DRAM has difficulties being used in an application to the digital VTR which requires data processing having large capacity and high speed. Further, in order to perform the error correcting and modifying processing, reliability information for a data block subject to the error correcting processing and management information for performing the modifying processing based on a result of the error correcting processing are needed conventionally, the information pieces are stored in a memory or register which is separate from that for the data block, raising a problem that superfluous memory means is needed.

SUMMARY OF THE INVENTION

The present invention contemplates elimination of the prior art problems and it is an object of the present invention to provide a data memory apparatus which can reduce the number of access operations to a DRAM so as to permit its use in an application to digital VTR's and which can dispense with superfluous memory means for performing the error correcting and modifying processing.

To accomplish the above object, a data memory apparatus according to the present invention comprises first error correcting means for receiving a data block which is a unit of one processing of an error correcting code, performing the data error correcting processing, assigning an error correction result code obtained by coding information about reliability against data errors of the data block to a data block subject to the error correcting processing and delivering a resulting data block; a RAM adapted to store the data block delivered out of the first error correcting means, the RAM having a two-dimensional matrix address space and being accessible in a unit of row address; row address access means for generating a row address of a data block memory area set on the RAM in correspondence to the data block delivered out of the first error correcting means so as to access the RAM; column address initial value generating means for generating a column address initial value in the data block memory area in correspondence to the data block delivered out of the first error correcting means; and sequential column address access means for generating sequential column addresses in the data block memory area on the basis of the column address initial value so as to access the data block memory area for read or write of the data block.

With the construction as above, when writing a data block to the RAM, a data block assigned with a correction result code delivered out of the first error correcting means is written by accessing the RAM by means of the row address access means, column address initial value generating means and sequential column address access means. When reading a data block from the RAM, access to the RAM is effected also by means of the row address access means, column address initial value generating means and sequential column address access means. Through this operation, the RAM can be accessed for the data block by a minimal number of access operations and as a result, access can be effected at a high speed to permit the data processing of large capacity and high speed in, for example, the digital VTR. Further, no separate memory or register is needed for storing a correction result code obtained by coding information about reliability against data errors of the data block and hence, the circuit scale can be small. In addition, the number of access operations can be minimized on condition that the correction result code and the data block are stored in the same RAM, thereby permitting error correcting processing having large capacity and high speed.

Preferably, the data memory apparatus of the present invention comprises management information generating means which generates management information for designating any one of a plurality of data block memory areas on a row address, and column address access means which generates a column address for storing the management information so as to perform accessing for write and read of the management information.

With the above construction, the management information generated by the management information generating means is stored on the same row of the same RAM as the data block by means of the row address access means and the column address access means. The column address access means then reads the management information and accesses the RAM by consulting the contents of the management information. Through this operation, no separate memory or register is needed for storing the management information for performing the modifying processing based on a result of the error correcting processing and hence, the circuit scale can be small. In addition the number of access operations can be minimized on condition that the management information and the data block are stored in the same RAM, thereby permitting error modifying processing having large capacity and high speed.

BRIEF DESCRIPTION OF THE DRAWINGS

FIG. 10 is a chart of access timings for a read operation of an outer error correction in the second embodiment of the present invention.

DESCRIPTION OF THE PREFERRED EMBODIMENTS

A first embodiment of the present invention will now be described with reference to the accompanying drawings.

Figure 1:
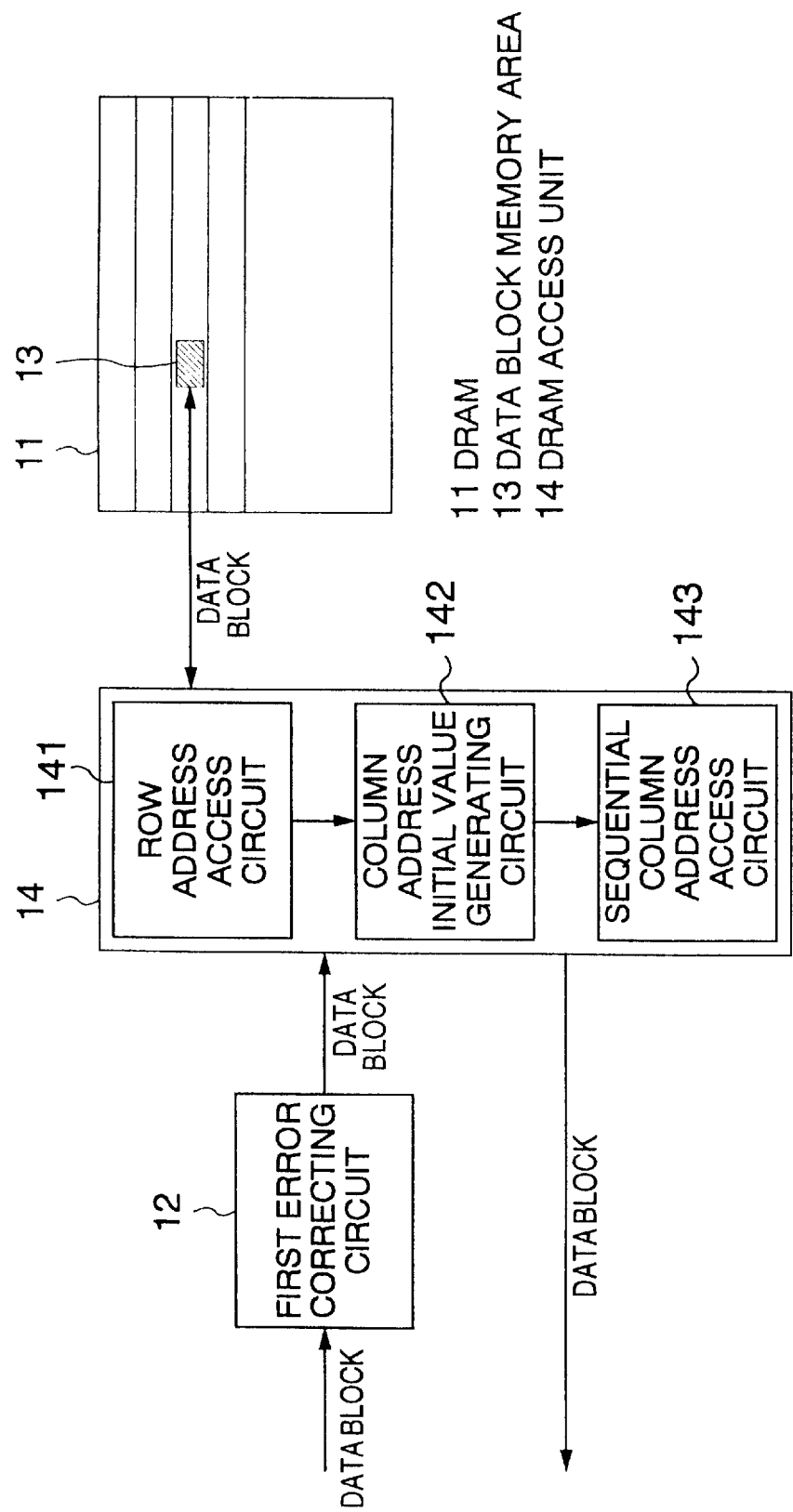
FIG. 1 is a block diagram showing the construction of a data memory apparatus in a first embodiment of the present invention.

FIG. 1 is a block diagram showing the construction of a data memory apparatus in the first embodiment of the present invention. In FIG. 1, a first error correcting circuit 12 receives a data block of 85 bytes and delivers a data block with correction result code of 78 bytes to a DRAM access unit 14. The DRAM access unit 14 then performs a write operation of the data block, delivered out of the first error correcting circuit 12, to a DRAM 11 and a read operation of a data block from the DRAM 11 on the basis of an identification number assigned to the data block. The DRAM access unit 14 includes a row address access circuit 141, a column address initial value generating circuit 142 and a sequential column address access circuit 143. The row address access circuit 141 generates a row address of DRAM 11 corresponding to the identification number and accesses the DRAM 11, the column address initial value generating circuit 142 generates a column address initial value in a data block memory area 13 which is set on the DRAM 11 and which corresponds to the identification number, and the sequential column address access circuit 143 generates sequential column addresses in the data block memory area on the basis of the column address initial value and accesses the DRAM 11 to write the data block thereto. The DRAM 11 can store data of 2 bytes at one address and can operate in a page mode in which data pieces on the same row address can be accessed by merely updating the column address.

Figure 2:
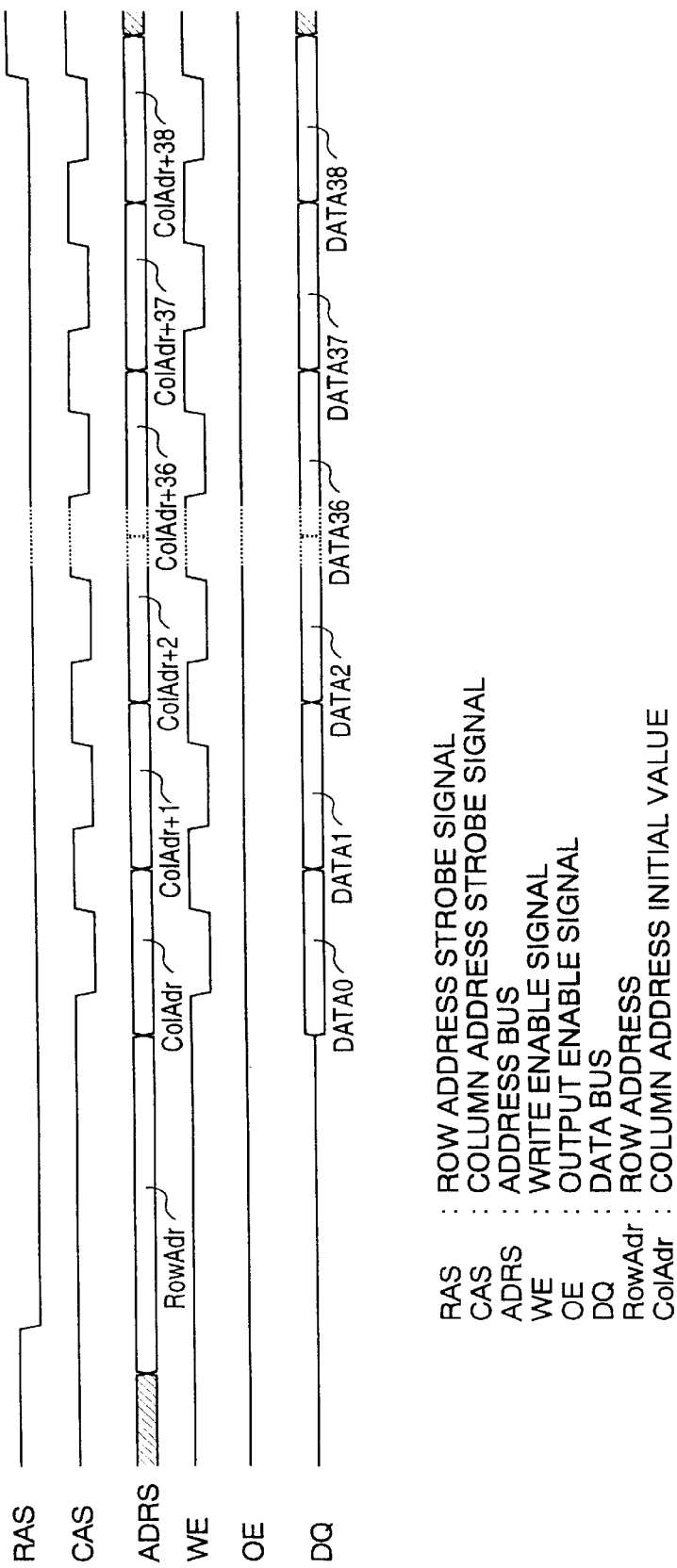
FIG. 2 is a chart of access timings for a write operation of a data block in the first and second embodiments of the resent invention.
Figure 3:
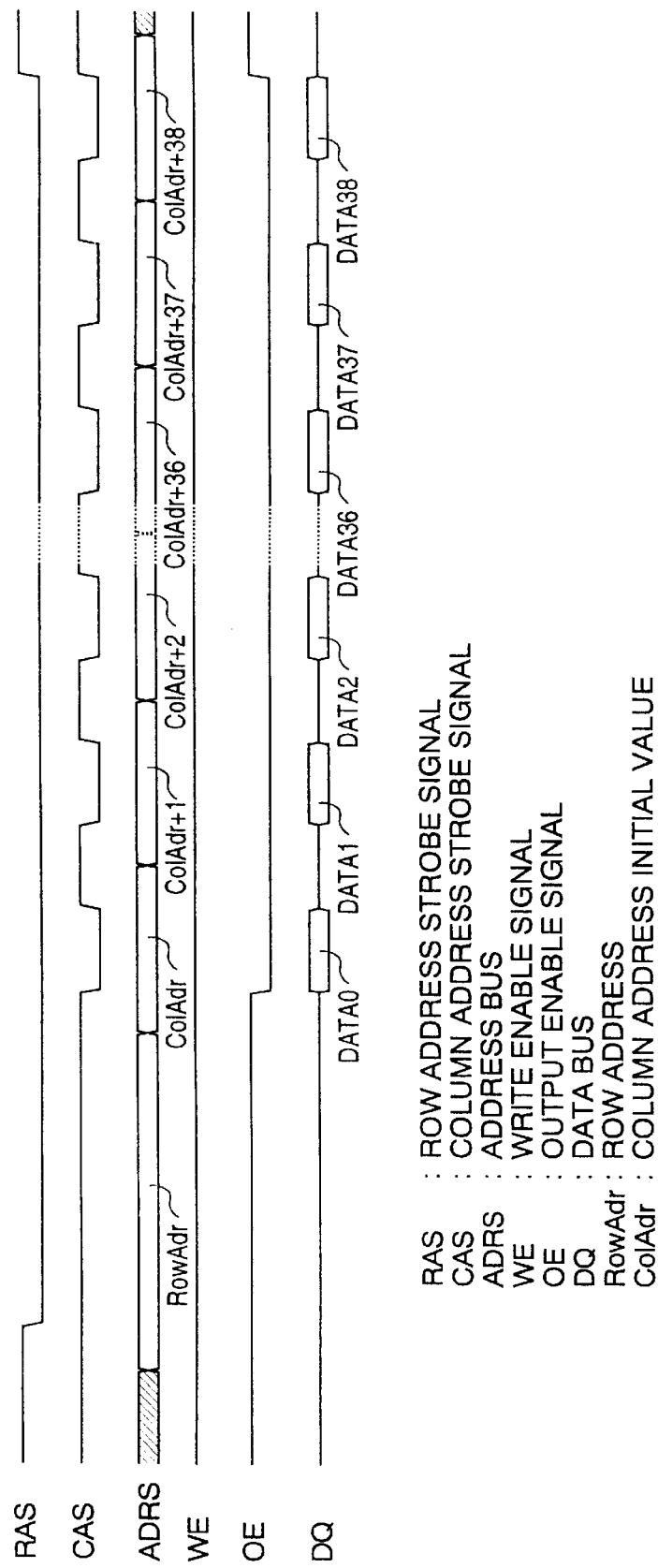
FIG. 3 is a chart of access timings for a read operation of a data block in the first embodiment of the present invention.

FIGS. 2 and 3 are charts of timings for accessing the DRAM 11 of the data memory apparatus in the first embodiment of the present invention. The timings in FIGS. 2 and 3 correspond to page mode cycles in which a row address of the DRAM 11 is designated by an address at the time that a row address strobe signal falls and a column address is designated by an address at the time that a column address strobe signal falls. In FIG. 2, when a write enable signal is low, data is stored at a designated address on the DRAM 11. In FIG. 3, when an output enable signal and the column address strobe signal are both low, data stored at a designated address on the DRAM 11 is read.

In connection with the data memory apparatus constructed as shown in FIG. 1, the operation of the first embodiment of the present invention will be described hereunder with reference to FIGS. 2 and 3.

Firstly, accessing the DRAM 11 to write a data block thereto will be described with reference to FIG. 2. The first error correcting circuit 12 receives the data block having a data part of 77 bytes and a parity part of 8 bytes, i.e., 85 bytes in total, performs the error correcting processing, assigns a correction result code obtained by coding information about reliability against data errors of the data block to a data block subject to the error correcting processing, and delivers a resulting data block of 78 bytes to the DRAM access unit 14. In the DRAM access unit 14, the row address access circuit 141 first generates a row address RowAdr on the basis of an identification number assigned to the data block to be written, renders the row address strobe signal low and accesses the DRAM 11. Then, the column address initial value generating circuit 142 generates a column address initial value ColAdr in a data block memory area to be accessed on the basis of the identification number assigned to the data block, and the sequential column address access circuit 143 generates sequential column addresses and renders the column address strobe and write enable signals low, whereby the 78-byte data block divided into Data 0 of 2 bytes, . . . and Data 38 of 2 bytes is written to the data block memory area on the DRAM 11 through 39 write operations in one page mode.

Next, accessing the DRAM 11 to read a data block therefrom will be described with reference to FIG. 3. In the DRAM access unit 14, the row address access circuit 141 first generates a row address RowAdr on the basis of an identification number assigned to the data block to be read and renders the row address strobe signal low to access the DRAM 11. Then, the column address initial value generating circuit 142 generates a column address initial value ColAdr in a data block memory area to be accessed on the basis of the identification number assigned to the data block, and the sequential column address access circuit 143 generates sequential column addresses on the basis of the generated initial value ColAdr and renders the column address strobe and output enable signals low, whereby the 78-byte data block divided into Data 0 of 2 bytes . . . and Data 38 of 2 bytes is read out of the data block memory area on the DRAM 11 through 39 read operations in one page mode.

As described above, according to the first embodiment of the present invention, by setting a data block memory area 13 on the DRAM 11 and generating sequential column addresses for a data block to be accessed by means of the sequential column address access circuit 143 to access the DRAM, the DRAM can be accessed for one data block in one page mode and the number of access operations to the DRAM can be reduced.

Further, by assigning a correction result code to a data block subject to the error correcting processing by means of the first error correcting circuit 12 and delivering a resulting data block, the correction result code can be accessed within the same page mode as that for the data block and there is no need of a separate memory for storage of the correction result code. In addition, the number of access operations to the DRAM can be minimized on condition that the data block and the correction result code are stored on the same DRAM.

Three operation modes of a second embodiment of the present invention will now be described with reference to the drawings.

Figure 4:
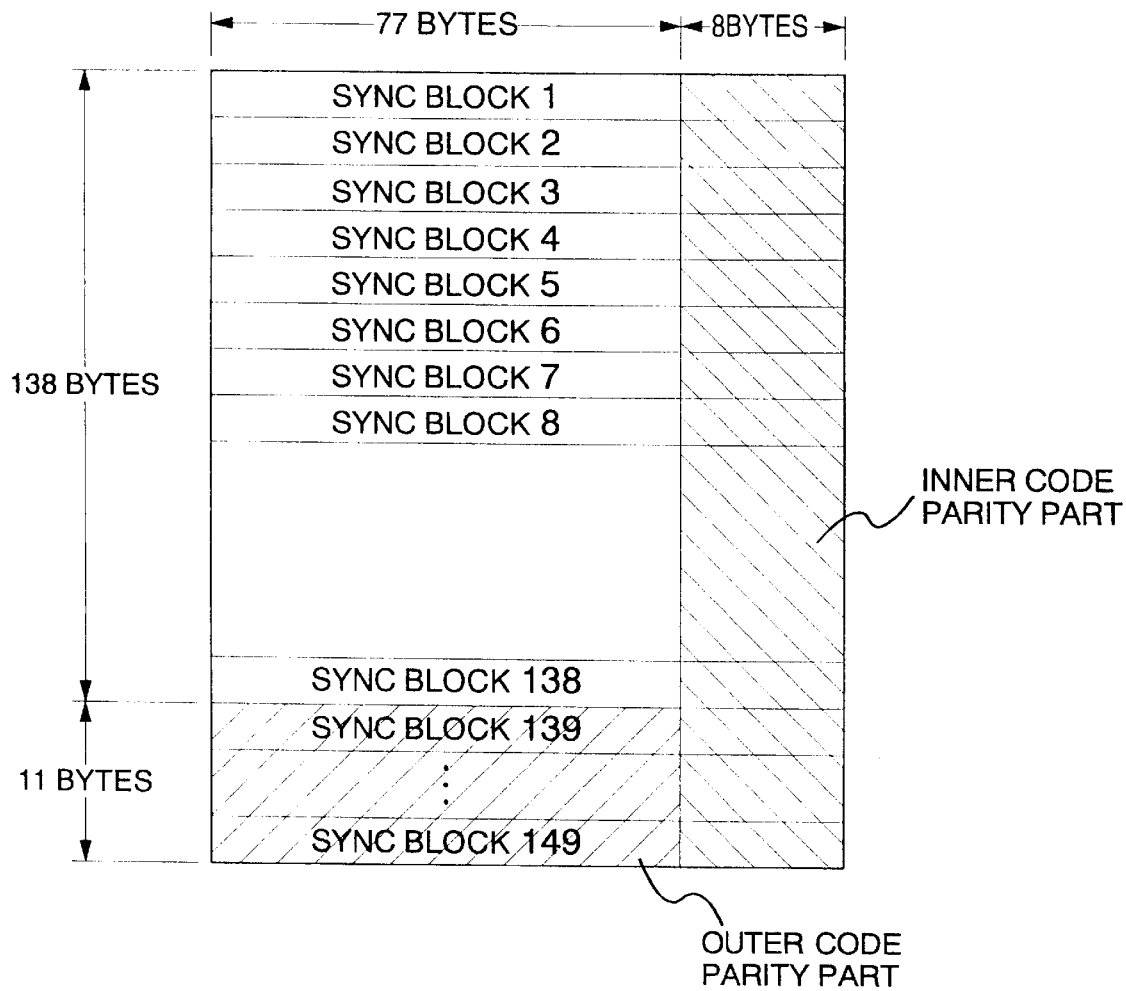
FIG. 4 is a diagram showing the structure of image data in the second embodiment of the present invention.

FIG. 4 is a diagram showing the structure of image data in the second embodiment of the present invention. This structure is called a DV format for use in digital VTR's in which a unit having a data part of 77 bytes and a parity part of 8 bytes and called a sync block is formed as an inner code constituting one data block and image data of one track having 149 sync blocks constitutes one product code. An outer code has a data part of 138 bytes and a parity part of 11 bytes. Each sync block is assigned with a sync block number serving as an identification number.

Figure 5:
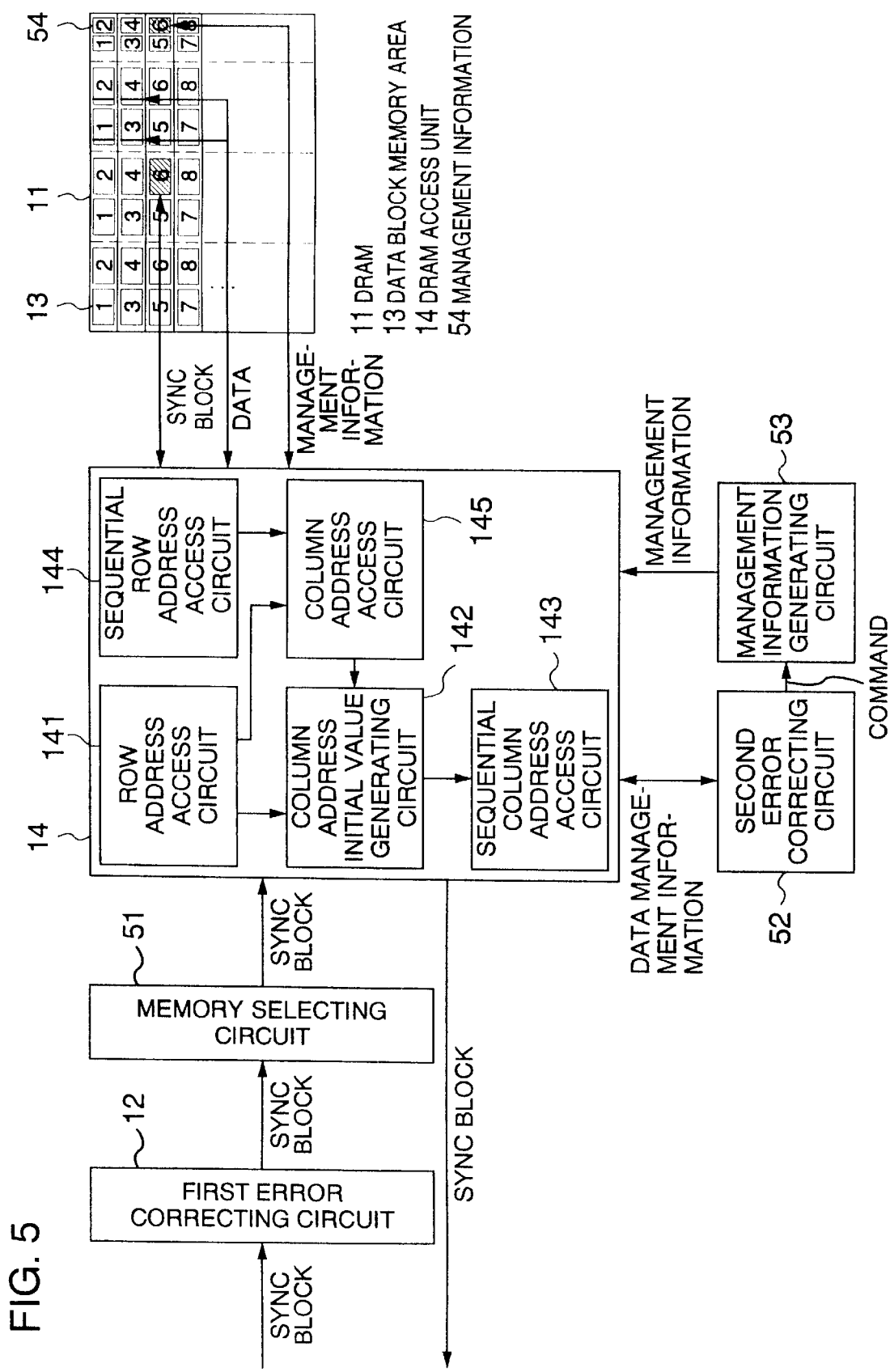
FIG. 5 is a block diagram showing the construction of a data memory apparatus in the second embodiment of the present invention.
Figure 6:
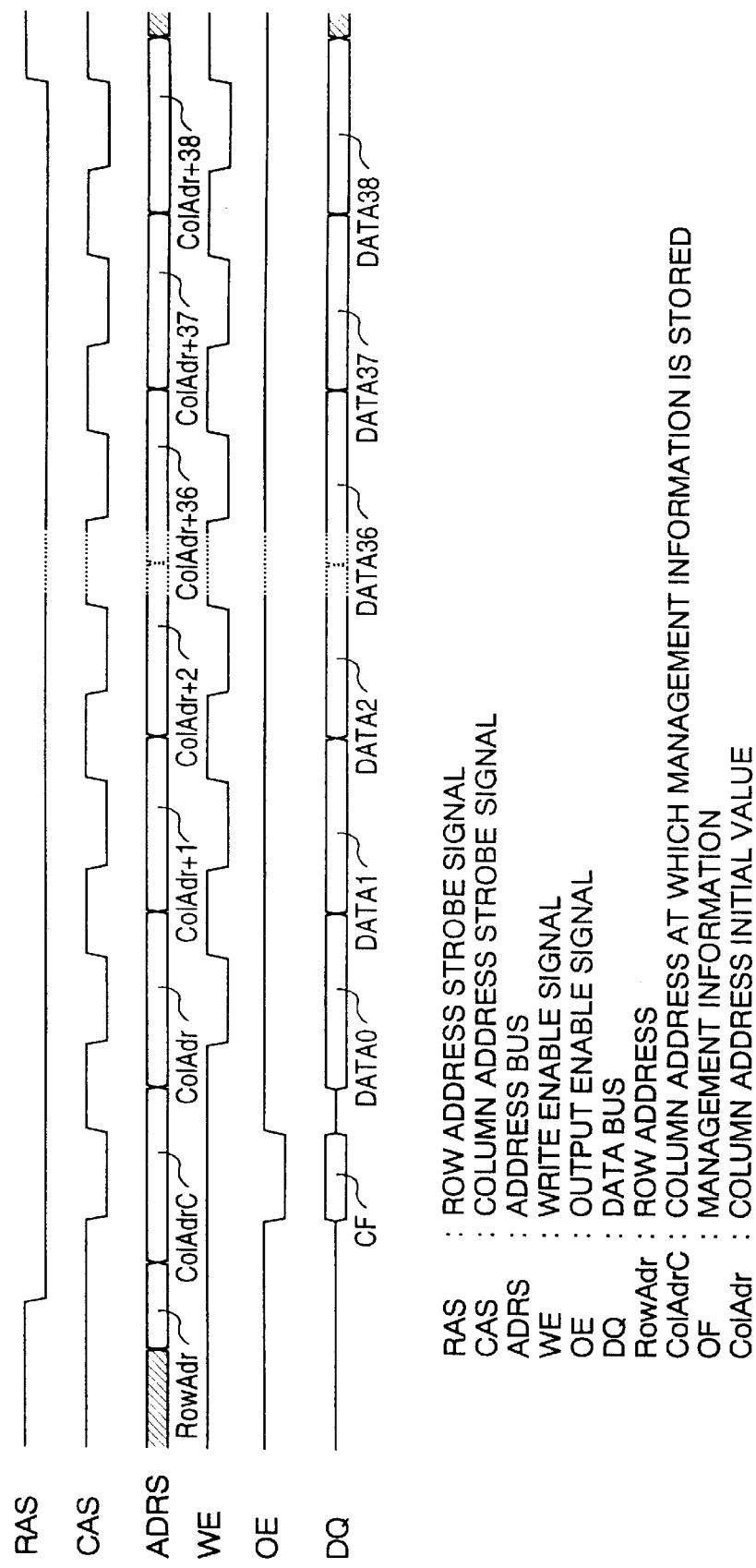
FIG. 6 is a chart of access timings for a write operation of a data block in the second embodiment of the present invention.

FIG. 5 is a block diagram showing the construction of a data memory apparatus in the second embodiment of the present invention. Referring to FIG. 5, a data block memory area 13 is operative in a page mode. Three sets of data block memory areas 13 for two sync block numbers are arranged on one row address of a DRAM 11 which stores data of 2 bytes at one address. A first error correcting circuit 12 receives a sync block of 85 bytes and delivers a sync block with correction result code of 78 bytes to a memory selecting circuit 51. When storing the sync block delivered out of the first error correcting circuit 12 in the DRAM 11, the memory selecting circuit 51 delivers the sync block to a DRAM access unit 14. Then, the DRAM access unit 14 performs, on the basis of an identification number assigned to a sync block, write of the sync block delivered out of the memory selecting circuit 51 to the DRAM 11, a read operation of the sync block from the DRAM 11, and data access between a second error correcting circuit 52 or a management information generating circuit 53 and the DRAM 11 during the outer code error correcting processing. The DRAM access unit 14 includes a row address access circuit 141, a column address initial value generating circuit 142, a sequential column address access circuit 143, a sequential row address access circuit 144 and a column address access circuit 145. When accessing a sync block, the row address access circuit 141 generates a row address of DRAM 11 corresponding to a sync block number and accesses the DRAM 11 at the row address, the column address access circuit 145 reads management information 54 for designating one of the data block memory areas which corresponds to the same sync block number and which is to be accessed, the column address initial value generating circuit 142 generates a column address initial value in the data block memory area to be accessed, and the sequential column address access circuit 143 generates sequential column addresses in the data block memory area on the basis of the column address initial value and performs accessing to write or read the sync block. During the outer code error correcting processing, the sequential row address access circuit 144 generates sequential row addresses of the DRAM 11 and accesses the DRAM, and the column address access circuit 145 generates a column address to access the DRAM 11 and data. The second error correcting circuit 52 reads data from the DRAM 11 by way of the DRAM access unit 14, delivers data subject to the error correcting processing to the DRAM access unit 14, and commands the management information generating circuit 53 to rewrite the management information 54 in order to perform the modifying processing. Then, the management information generating circuit 53 delivers the thus generated management information to the DRAM access unit.

Figure 7:
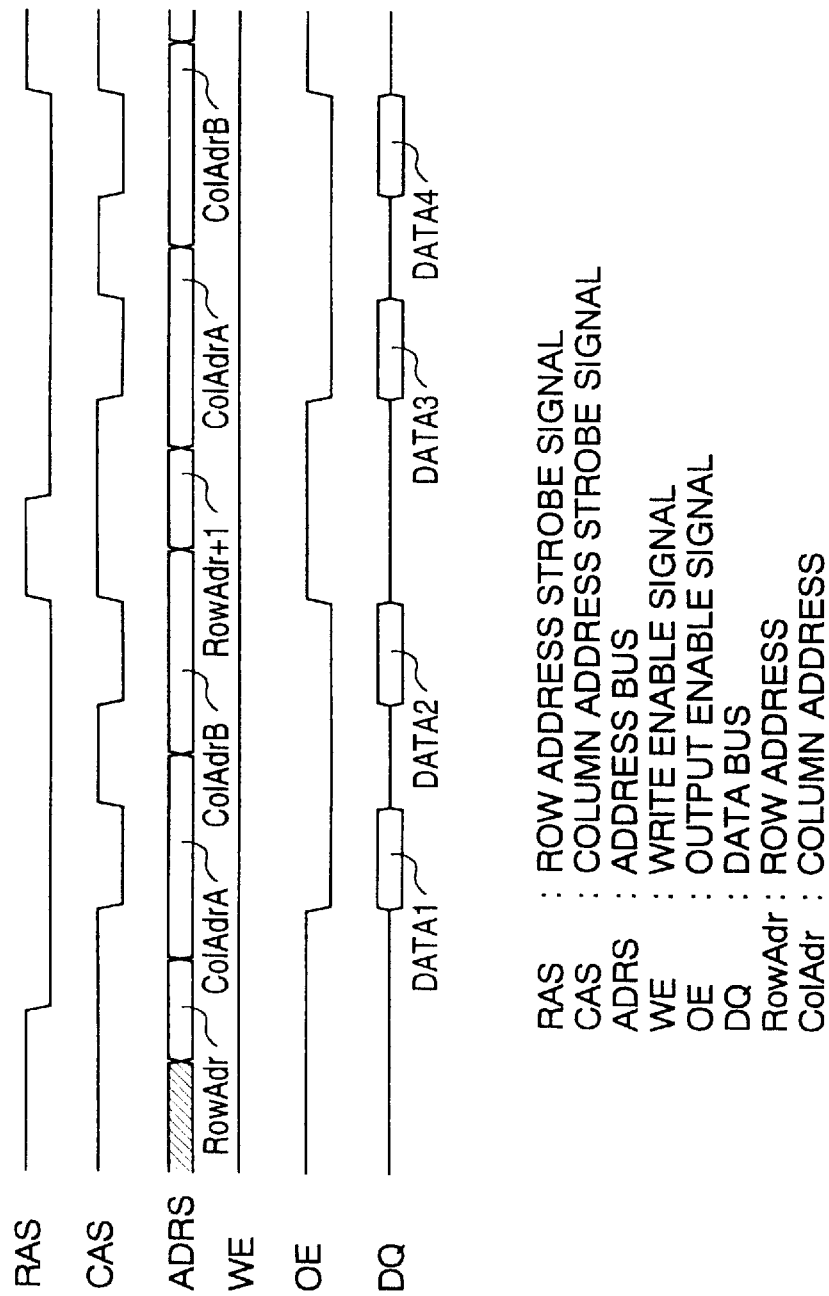
FIG. 7 is a chart of access timings for a read operation of an outer code error correction in the second embodiment of the present invention.
Figure 8:
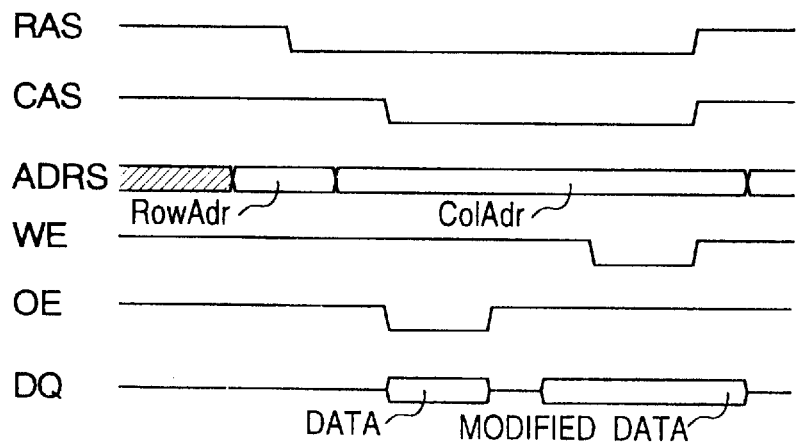
FIG. 8 is a chart of access timings for rewrite operation of an outer code error correction in the second embodiment of the present invention.

FIGS. 2, 6, 7, 8, 9 and 10 are charts of timings for accessing the DRAM 11 of the data memory apparatus in the second embodiment of the present invention. The timings in FIGS. 6, 7, 9 and 10 correspond to page mode cycles and an address of the DRAM 11 is designated in a similar way to that shown in FIG. 2 or 3 in connection with the first embodiment of the invention. FIG. 8 shows timings for a read/modify/write cycle in which an address accessed for a read operation is subsequently accessed for a write operation, and an address designation is carried out in a way similar to that in the page mode cycle.

In connection with the data memory apparatus constructed as shown in FIG. 5, a first one of three operation modes in the second embodiment of the present invention will now be described with reference to FIGS. 2, 4, 7, 8 and 9.

Accessing the DRAM 11 to write a sync block thereto will first be described by taking a sync block of number 6, for instance. Firstly, the first error correcting circuit 12 receives the sync block of number 6 having a data part of 77 bytes and a parity part of 8 bytes, i.e., 85 bytes in total, performs the error correcting processing of an inner code, assigns a correction result code obtained by coding information about reliability against data errors of the sync block to a sync block subject to error correction and delivers a resulting sync block of 78 bytes to the memory selecting circuit 51. The memory selecting circuit 51 delivers the input sync block as it is to the DRAM access unit 14. In the DRAM access unit 14, the row address access circuit 141 first generates a row address RowAdr on which a data block memory area corresponding to the sync block number of number 6 exists and renders the row address strobe signal low to access the DRAM 11. Then, the column address initial value generating circuit 142 generates a column address initial value ColAdr within predetermined one of three data block memory areas corresponding to the sync block number 6, and the sequential column address access circuit 143 generates sequential column addresses on the basis of the generated initial value ColAdr and renders the column address strobe and write enable signals low, whereby the 78-byte data block divided into Data 0 of 2 bytes . . . and Data 38 of 2 bytes is written to the data block memory area of the DRAM 11 through 39 write operations in one page mode.

Next, accessing the DRAM 11 to perform the outer code error correction will be described with reference to FIGS. 7 and 8. Firstly, data necessary for performing the outer code error correcting processing is read out of the DRAM 11 by means of the DRAM access circuit 14. Referring to FIG. 7, the sequential row address access circuit 144 generates a row address RowAdr on which sync blocks of numbers 1 and 2 are stored and renders the row address strobe signal low to access the DRAM 11. Then, the column address access circuit 145 generates column addresses ColAdrA and ColAdrB at the same byte position within sync blocks stored in predetermined ones of the data block memory areas corresponding to the sync blocks of numbers 1 and 2 and renders the column address strobe and output enable signals low to read data to be subjected to the correcting processing. Subsequently, the sequential row address access circuit 144 automatically generates a row address RowAdr+1 on which sync blocks of numbers 3 and 4 are stored and renders the row address strobe signal low to access the DRAM 11, and the column address access circuit 145 generates column addresses ColAdrA and ColAdrB at the same byte position within sync blocks stored in data block memory areas corresponding to the sync blocks of numbers 3 and 4 and renders the column address strobe and output enable signals low to read data to be subjected to the correcting processing. Thereafter, similar accessing is repeated until the final sync block of number 149 is accessed, so that the data necessary for the outer code error correcting processing is read out of the DRAM 11 by means of the DRAM access unit 14. Then, the second error correcting circuit 52 receives the data read out of the DRAM 11 through the sequential accessing and performs outer code error correction by consulting the correction result code of the inner code error correction assigned by the first error correcting circuit 12, causing the DRAM access unit 14 to effect rewrite of the correction result on the DRAM 11. In order to carry out the modifying processing based on the correction result, the second error correcting circuit 52 also commands the management information generating circuit 53 to rewrite the corresponding management information, the management information generating circuit 53 generates management information for deliver it to the DRAM access unit 14, and the DRAM access unit 14 rewrites management information on the DRAM 11. The rewrite accessing is carried out in a read/modify/write cycle in which as shown in FIG. 8. The row address access circuit 141 generates a row address RowAdr on which data or management information to be rewritten is stored and renders the row address strobe signal low to access the DRAM 11, and the column address access circuit 145 generates a column address ColAdr on which the data or management information to be rewritten is stored, renders the column address strobe and output enable signals low to read data or management information before rewrite, modifies the read data or management information, and renders the write enable signal low to write modified data or management information to the DRAM 11.

Figure 9:
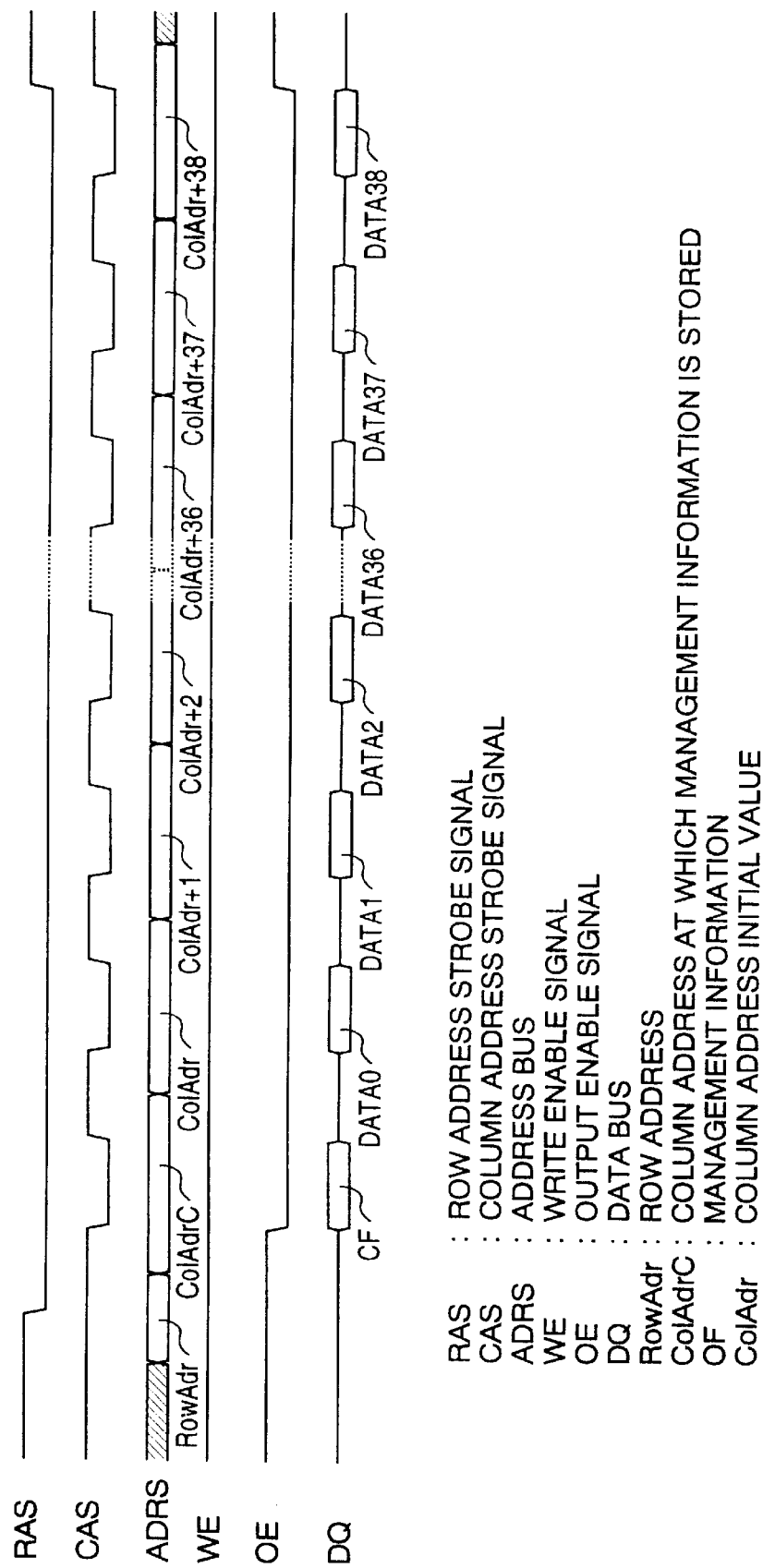
FIG. 9 is a chart of access timings for a read operation of a data block in the second embodiment of the present invention.

Referring now to FIG. 9, accessing the DRAM 11 to read a sync block therefrom will be described by taking a sync block of number 6, for instance. In the DRAM access unit 14, the row address access circuit 141 first generates a row address RowAdr on which a data block memory area corresponding to the sync block of number 6 exists and renders the row address strobe signal low to access the DRAM 11. Subsequently, the column address access circuit 145 generates a column address ColAdrC at which management information for managing the data block memory area corresponding to the sync block of number 6 is stored and renders the column address strobe and output enable signals low to read management information CF, the column address initial value generating circuit 142 generates a column address initial value ColAdr in a data block area designated by the read-out management information, and the sequential column address access circuit 143 generates sequential column addresses on the basis of the generated initial value ColAdr and renders the column address strobe and output enable signals low, whereby the 78-byte sync block divided into Data0 of 2 bytes ... and Data38 of 2 bytes is read out of the data block memory area on the DRAM 11 through 39 read operations in one page mode.

As described above, according to the first operation mode of the second embodiment of the present invention, the management information generating circuit 53 is provided to permit the DRAM access unit 14 to store the management information for performing the modifying processing in the DRAM similarly to the sync block and therefore, the memory for separate storage of the management information can be dispensed with, thus reducing the number of circuits.

Since the inner code correction result code is assigned to the sync code by means of the first error correcting circuit 12, erasure correction which consults the inner code correction result can also be effected by means of the second error correcting circuit 52 without increasing the number of access operations to the DRAM.

Further, since the management information rewritten in accordance with a result of the outer code correction by the second error correcting circuit 52 is stored on the same row address as the object sync block, accessing the DRAM to read the sync block by consulting the management information can be effected within the same page mode, with the result that the modifying processing, in which a sync block failing to undergo error correction is not delivered but another sync block having the same sync block number and succeeding in undergoing error correction can selectively be delivered, can be completed in one page mode, thereby ensuring that the number of access operations to the DRAM can be minimized on condition that the sync block and the management information are stored on the same DRAM.

Rewriting data on the DRAM 11 to a resulting from correction by the second error correcting circuit 52 or rewriting management information on the DRAM 11 to management information generated by the management information generating circuit 53 may be replaced with writing data or management information after modification to the DRAM 11 through the mere write cycle. In this case, the number of access operations to the DRAM 11 can be reduced on condition that a separate memory or register is necessarily provided.

In connection with the data memory apparatus constructed as shown in FIG. 5, a second one of three operation modes in the second embodiment of the present invention will now be described with reference to FIGS. 4, 6, 8, 9 and 10.

Accessing the DRAM 11 to write a sync block thereto will first be described by taking a sync block of number 6, for instance. Firstly, the first error correcting circuit 12 receives the sync block of number 6 having a data part of 77 bytes and a parity part of 8 bytes, i.e., 85 bytes in total, performs the error correcting processing of an inner code, assigns a correction result code obtained by coding information about reliability against data errors of the sync block to a sync block subject to error correction and delivers a resulting sync block of 78 bytes to the memory selecting circuit 51. The memory selecting circuit 51 delivers the input sync block as it is to the DRAM access unit 14. In the DRAM access unit 14, the row address access 141 first generates a row address RowAdr on which a data block memory area corresponding to the sync block of number 6 exists and renders the row address strobe signal low to access the DRAM 11. Then, the column address access circuit 145 generates a column address ColAdr at which management information for managing the data block memory area corresponding to the sync block of number 6 is stored and renders the column address strobe and output enable signals low to read management information CF, the column address initial value generating circuit 142 generates a column address initial value ColAdr within the data block memory area designated by the read-out management information, and the sequential column address access circuit 143 generates sequential column addresses on the basis of the generated initial value ColAdr and renders the column address strobe and write enable signals low, whereby the 78-byte data block divided into Data0 of 2 bytes ... Data38 of 2 bytes is written to the data block memory area on the DRAM 11 through 39 write operations in one page mode.

Next, accessing the DRAM 11 to perform the outer code error correction will be described with reference to FIGS. 8 and 10. Firstly, data necessary for performing the outer error correcting processing is read out of the DRAM 11 by means of the DRAM access unit 14. Referring to FIG. 10, the sequential row address access circuit 144 generates a row address RowAdr on which sync blocks of numbers 1 and 2 are stored and renders the row address strobe signal low to access the DRAM 11. Then, the column address access circuit 145 generates column addresses ColAdrCA and ColAdrCB at which management information pieces for managing data block memory areas corresponding to the sync blocks of numbers 1 and 2 are stored, renders the column address strobe and output enable signals low to read management information pieces CF1 and CF2, regenerates column addresses ColAdr1 and ColAdr2 at the same byte position in sync blocks stored in data block memory areas designated by the respective management information pieces and renders the column address strobe and output enable signals low to read correcting processing object data. Subsequently, the sequential row address access circuit 144 automatically generates a row address RowAdr+1 on which sync blocks of numbers 3 and 4 are stored and renders the row address strobe signal low to access the DRAM 11, and the column address access circuit 145 generates column addresses ColAdrCA and ColAdrCB at which management information pieces for managing data block memory areas corresponding to the sync blocks of numbers 3 and 4 are stored, renders the column address strobe and output enable signals low to read management information pieces CF3 and CF4, regenerates column addresses ColAdr3 and ColAdr4 at the same byte position in sync blocks stored in data block memory areas designated by the respective management information pieces and renders the column address strobe and output enable signals low to read correcting processing object data. Thereafter, similar accessing is repeated until the final sync block of number 149 is accessed, so that the data necessary for the outer code error correcting processing is read out of the DRAM 11 by means of the DRAM access unit 14. Then, the second error correcting circuit 52 receives the data read out of the DRAM 11 through the sequential accessing and performs outer code error correction by consulting a correction result code of the inner code error correction assigned by the first error correcting circuit 12, causing the DRAM access unit 14 to effect rewrite of the correction result on the DRAM 11. In order to perform the modifying processing based on the correction result, the second error correcting circuit 52 also commands the management information generating circuit 53 to rewrite the corresponding management information, the management information generating circuit 53 generates management information to deliver it to the DRAM access unit 14, and the DRAM access unit 14 rewrites management information on the DRAM 11. The rewrite accessing is a similar operation to the first operation mode of the second embodiment of the present invention.

Accessing the DRAM 11 to read the sync block therefrom is a similar operation to the first operation mode of the second embodiment of the present invention.

As described above, according to the second operation mode of the second embodiment of the present invention, by performing, within the same page mode, accessing for writing and reading of a sync block, which is carried out by consulting management information rewritten in accordance with a result of the outer code correction by the second error correcting circuit 52, the modifying processing different from the first operation mode can be ensured through one page mode and besides the number of access operations to the DRAM can be minimized on condition that the sync block and the management information are stored in the same DRAM.

In the outer code error correcting access, the correcting processing object data may be read out of the DRAM after all of the management information pieces have been read. In this case, a separate memory or register is needed but the management of accessing the DRAM can be more simplified.

Further, rewriting data on the DRAM 11 resulting from correction by the second error correcting circuit 52 or rewriting management information on the DRAM 11 to management information generated by the management information generating circuit 53 may be replaced with writing data or management information after modification to the DRAM 11 through the mere write cycle. In this case, the number of access operations to the DRAM 11 can be reduced on condition that a separate memory or register is necessarily provided.

In connection with the data memory apparatus constructed as shown in FIG. 5, a third one of three operation modes in the second embodiment of the present invention will now be described.

When writing a sync block to the DRAM 11, the first error correcting circuit 12 first receives the sync block having a data part of 77 bytes and a parity part of 8 bytes, i.e., 85 bytes in total, performs the error correcting processing of an inner code, assigns a correction result code obtained by coding information about reliability against data errors of the sync block to a sync block subject to error correction and delivers a resulting sync block of 78 bytes to the memory selecting circuit 51. The memory selecting circuit 51 determines that the sync block should not be written to the DRAM 11 if the contents of the correction result code assigned to the input sync block indicates that reliability of the data cannot be maintained and does not deliver the sync block. If the sync block is determined to be allowed to be written to the DRAM 11, it is delivered to the DRAM access unit 14 and is then written to the DRAM 14 by means of the DRAM access unit 14 through a similar operation to the first operation mode or the second operation mode of the second embodiment of the present invention.

As described above, according to the third operation mode of the second embodiment of the present invention, by providing the memory selecting circuit 51, a sync block for which reliability cannot be maintained without the outer code error correction can be prevented from being written to the DRAM 11 and therefore, that sync block can be prevented from being read out of the DRAM 11.

After a sync block for which reliability cannot be maintained is prevented from being written to the DRAM 11 by means of the memory selecting circuit 51, the outer code error correction may be carried out. In this case, data of higher reliability can be ensured with the cost that there is the possibility that data necessary for the outer code error correcting processing will not complete.

What is claimed is:
1. A data memory apparatus comprising:
   first error correcting means for receiving an input data block having a data part and an error correcting code part, performing data error correcting processing on the input data block, determining an output data block having an error correction result code obtained by coding error reliability information about the input data block, and outputting the output data block;
   a random-access memory (RAM) for storing the output data block output from said first error correcting means, said RAM having a two-dimensional matrix address space and being page accessible by row address;
   row address access means for generating a row address of a data block memory area of said RAM;
   column address initial value generating means for generating a column address initial value for the data block memory area of said RAM; and
   sequential column address access means for generating sequential column addresses in the data block memory area of said RAM based on the column address initial value so as to page access said RAM using the row address generated by said row address access means.

2. A data memory apparatus according to claim 1 in which a plurality of data block memory areas are provided on one row address of said RAM, said data memory apparatus further comprising:

management information generating means for generating management information for designating one of the plurality of data block memory areas on the row address; and column address access means for generating a column address for storing the management information, said row address access means generating a same row address for said management information and for a data block memory area to be managed, said column address initial value generating means generating a column address initial value for said data block memory area to be managed.

3. A data memory apparatus according to claim 2, further comprising:

sequential row address access means for generating sequential row addresses in accordance with a preset control sequence to access said RAM; and second error correcting means for performing error correcting processing by consulting the correction result code of said output data block and commanding, in accordance with a result of the error correcting processing, said management information generating means to rewrite management information stored in said RAM, said column address access means generating a column address within a data block memory area to access said RAM with said sequential row address access means.

4. A data memory apparatus according to claim 3, wherein said column address access means reads management information stored in said RAM and regenerates a column address within a data block memory area designated by the read management information to access said RAM.

5. A data memory apparatus according to claim 1, wherein said input data block comprises moving image data, wherein said output data block is assigned an identification number indicative of an arranging position within a frame when said input datablock is stored in said RAM, wherein said row address access means generates a row address in one to one correspondence with said identification number to access said RAM.

6. A data memory apparatus according to claim 2, wherein said input data block comprises moving image data, wherein said output data block is assigned an identification number indicative of an arranging position within a frame when said input datablock is stored in said RAM, wherein said row address access means generates a row address in one to one correspondence with said identification number to access said RAM.

7. A data memory apparatus according to claim 3, wherein said input data block comprises moving image data, wherein said output data block is assigned an identification number indicative of an arranging position within a frame when said input datablock is stored in said RAM, wherein said row address access means generates a row address in one to one correspondence with said identification number to access said RAM.

8. A data memory apparatus according to claim 4, wherein said input data block comprises moving image data, wherein said output data block is assigned an identification number indicative of an arranging position within a frame when said input datablock is stored in said RAM, wherein said row address access means generates a row address in one to one correspondence with said identification number to access said RAM.

9. A data memory apparatus according to claim 5, wherein when said first error correcting means determines whether said input data block is insufficiently reliable to be processed for being stored in said RAM.

10. A data memory apparatus according to claim 6, wherein when said first error correcting means determines whether said input data block is insufficiently reliable to be processed for being stored in said RAM.

11. A data memory apparatus according to claim 7, wherein when said first error correcting means determines whether said input data block is insufficiently reliable to be processed for being stored in said RAM.

12. A data memory apparatus according to claim 8, wherein when said first error correcting means determines whether said input data block is insufficiently reliable to be processed for being stored in said RAM.

\* \* \* \* \*